(12) United States Patent
Ward et al.

(10) Patent No.: US 11,367,696 B2
(45) Date of Patent: Jun. 21, 2022

(54) RADIO FREQUENCY AMPLIFIERS HAVING IMPROVED SHUNT MATCHING CIRCUITS

(71) Applicant: Wolfspeed, Inc., Durham, NC (US)

(72) Inventors: Simon Ward, Morgan Hill, CA (US); Richard Wilson, Morgan Hill, CA (US); Alexander Komposch, Morgan Hill, CA (US)

(73) Assignee: Wolfspeed, Inc., Durham, NC (US)

( * ) Notice: Subject to any disclaimer, the term of this patent is extended or adjusted under 35 U.S.C. 154(b) by 317 days.

(21) Appl. No.: 16/737,188

(22) Filed: Jan. 8, 2020

(65) Prior Publication Data

US 2021/0210444 A1 Jul. 8, 2021

(51) Int. Cl.
| | |
|---|---|
| *H01L 23/66* | (2006.01) |
| *H03F 1/56* | (2006.01) |
| *H01L 23/00* | (2006.01) |
| *H05K 1/02* | (2006.01) |
| *H03F 3/195* | (2006.01) |

(52) U.S. Cl.
CPC .............. *H01L 23/66* (2013.01); *H01L 24/45* (2013.01); *H03F 1/565* (2013.01); *H03F 3/195* (2013.01); *H05K 1/0243* (2013.01); *H01L 2223/6611* (2013.01); *H01L 2223/6655* (2013.01); *H01L 2223/6672* (2013.01)

(58) Field of Classification Search
CPC ............. H01L 23/66; H01L 2223/6655; H01L 2223/6672; H01L 2224/48195; H03F 3/19; H03F 3/195; H05K 1/0243
See application file for complete search history.

(56) References Cited

U.S. PATENT DOCUMENTS

| | | | |
|---|---|---|---|
| 2017/0117239 A1* | 4/2017 | Lembeye | ............ H01L 23/5227 |
| 2018/0254253 A1 | 9/2018 | Zhang et al. | |

* cited by examiner

*Primary Examiner* — Tucker J Wright
(74) *Attorney, Agent, or Firm* — Myers Bigel, P.A.

(57) ABSTRACT

RF amplifiers are provided that include a submount such as a thermally conductive flange. A dielectric substrate is mounted on an upper surface of the submount, the dielectric substrate having a first outer sidewall, a second outer sidewall that is opposite and substantially parallel to the first outer sidewall, and an interior opening. An RF amplifier die is mounted on the submount within the interior opening of the dielectric substrate, where a longitudinal axis of the RF amplifier die defines a first axis. The RF amplifier die is positioned so that a first angle defined by the intersection of the first axis with the first outer sidewall is between 5° and 45°. The dielectric substrate may be a ceramic substrate or a dielectric layer of a printed circuit board.

20 Claims, 12 Drawing Sheets

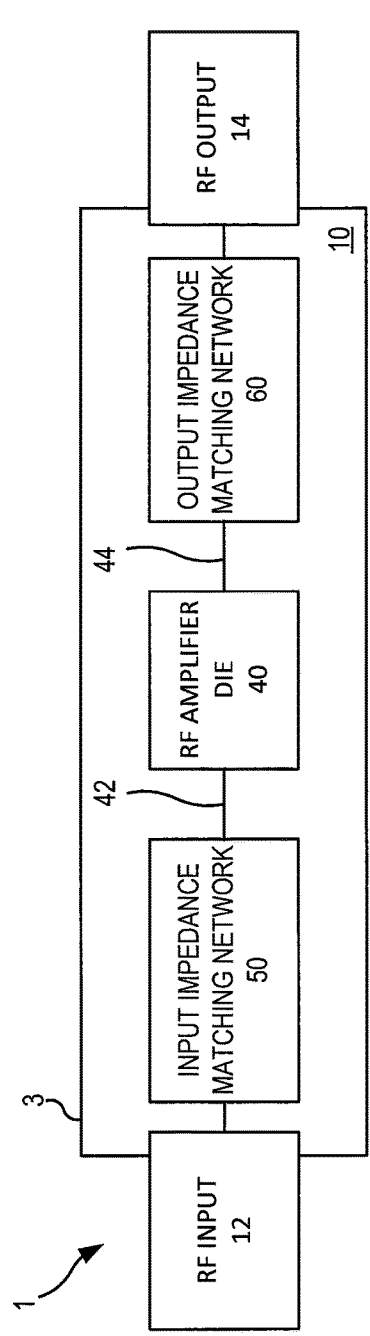
FIG. 1
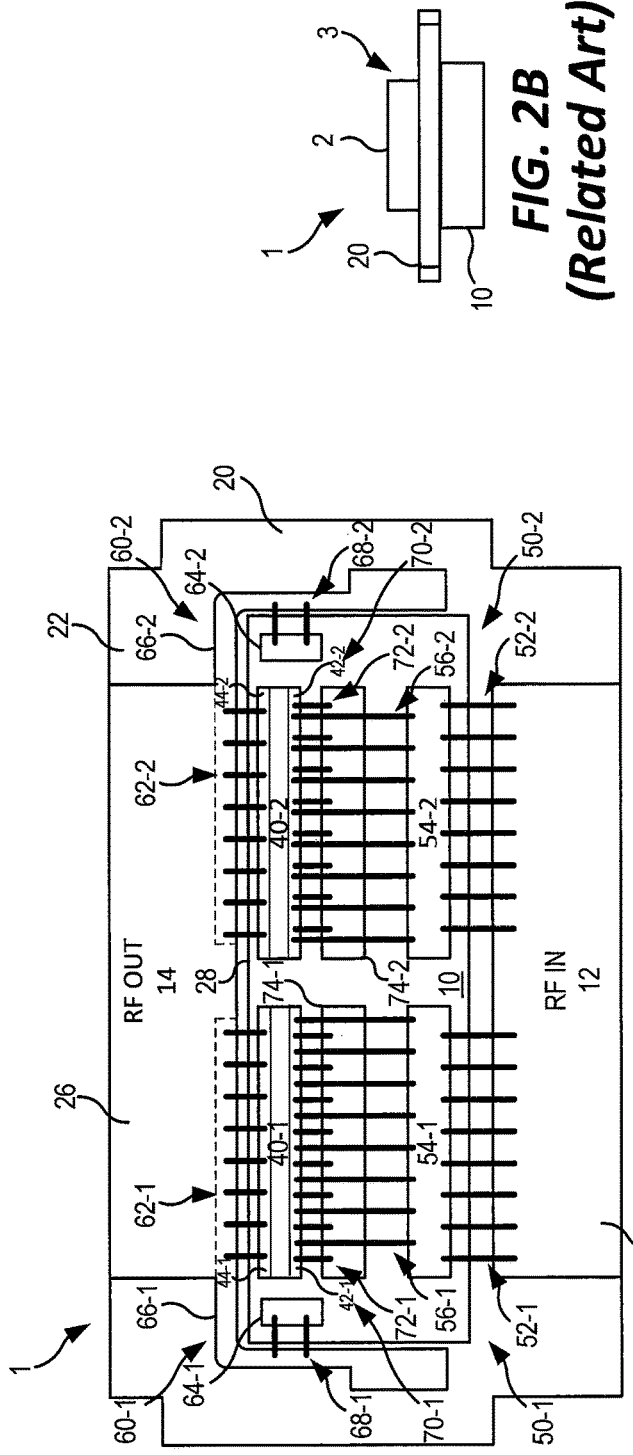
FIG. 2A (Related Art)
FIG. 2B (Related Art)

RADIO FREQUENCY AMPLIFIERS HAVING IMPROVED SHUNT MATCHING CIRCUITS

FIELD

The inventive concepts described herein relate to microelectronic devices and, more particularly, to radio frequency ("RF") amplifiers.

BACKGROUND

RF amplifiers are now in wide use in cellular telephone and other applications. These amplifiers may be implemented in silicon semiconductor materials or wide bandgap semiconductor materials such as silicon carbide ("SiC") and gallium nitride ("GaN") based materials. Silicon based RF amplifiers are typically implemented using laterally diffused metal oxide semiconductor ("LDMOS") transistors, and can exhibit high levels of linearity and may be relatively inexpensive to fabricate. GaN based High Electron Mobility Transistor ("HEMT") devices are typically used for higher power and/or higher frequency operations where LDMOS transistor amplifiers may have inherent performance limitations.

The RF amplifier may include one or more amplification stages, with each stage typically implemented as a transistor amplifier. In order to increase the output power and current handling capabilities, the transistor amplifiers are typically implemented as so-called "unit cell" transistors in which a large number of individual "unit cell" transistors are disposed electrically in parallel. The RF amplifier may be implemented as a single integrated circuit chip or "die," or may include a plurality of dies. The one or more dies are typically disposed in a package having a plurality of leads that are used to connect the RF amplifier to other electronic circuits.

The RF amplifiers often include an input impedance matching circuit that is designed to improve the impedance match between an RF input to the amplifier and an input RF transmission line, and/or an output impedance matching circuit that is designed to improve the impedance match between an RF output to the amplifier and an output RF transmission line. If multiple RF amplifier dies are coupled in series in the packaged RF amplifier, one or more interstage impedance matching circuits may also be provided. The RF amplifier die(s) as well as the impedance matching circuits may be enclosed in a package. Electrical leads may extend from the package that are used to electrically connect the RF amplifier dies to external circuit elements such as input and output RF transmission lines and bias voltage sources.

SUMMARY

Pursuant to embodiments of the present invention, RF amplifiers are provided that include a submount and a dielectric substrate that is mounted on an upper surface of the submount, the dielectric substrate having a first outer sidewall, a second outer sidewall that is opposite and substantially parallel to the first outer sidewall, and an interior opening. Conductive leads are provided on the dielectric substrate, and an RF amplifier die is mounted on the submount within the interior opening of the dielectric substrate. A longitudinal axis of the RF amplifier die defines a first axis, and a first angle defined by the intersection of the first axis with the first outer sidewall is between 5° degrees and 45°.

In some embodiments, RF amplifier further includes an input impedance matching capacitor die that is mounted on the upper surface of the submount within the interior opening in the dielectric substrate.

In some embodiments, a longitudinal axis of the input impedance matching capacitor die defines a third axis, and the first axis intersects the third axis at a third angle that is between 5° and 45°. The third angle may be between 10° and 40°, between 15° and 35° or between 20° and 30° in example embodiments.

In some embodiments, the RF amplifier may also include a plurality of first bond wires that electrically connect the input impedance matching capacitor die to the RF amplifier die. In some embodiments, a maximum height of a first of the first bond wires above the upper surface of the submount may be less than a maximum height of a second of the first bond wires above the upper surface of the submount. In some embodiments, all of the first bond wires have substantially a same inductance. In some embodiments, the first of the first bond wires may be closer to a center of the submount than is the second of the first bond wires. In some embodiments, respective heights of the plurality of first bond wires may decrease the closer the first bond wires are to the center of the submount.

In some embodiments, the RF amplifier may further include an output impedance matching capacitor die that is mounted on the upper surface of the submount within the interior opening in the dielectric substrate, wherein a longitudinal axis of the output impedance matching capacitor die defines a fifth axis, and the fifth axis intersects an axis defined by the first outer sidewall is at an angle of between 45° and 80°.

In some embodiments, the RF amplifier may further include a second RF amplifier die that has a longitudinal axis that defines a second axis, where the first and second axes intersect at an angle of between 90° and 170°.

In some embodiments, the dielectric substrate may be a dielectric layer of a printed circuit board and the conductive leads may comprise metal traces of the printed circuit board. In other embodiments, the dielectric substrate may be a ceramic substrate and the conductive leads may comprise metal leads and include metal leads that extend beyond a periphery of the ceramic substrate.

Pursuant to further embodiments of the present invention, RF amplifiers are provided that include a thermally conductive flange, a first RF amplifier die mounted on the upper surface of the thermally conductive flange within the interior opening in the dielectric substrate and a second RF amplifier die mounted on the upper surface of the thermally conductive flange within the interior opening in the dielectric substrate. These RF amplifiers further include an input section that comprises a first dielectric substrate with conductive paths thereon on a first side of the first and second RF amplifier dies and an output section that comprises a second dielectric substrate with conductive paths thereon on a second side of the first and second RF amplifier dies, the second side being opposite the first side. A longitudinal axis of the first RF amplifier die defines a first axis, a longitudinal axis of the second RF amplifier die defines a second axis, and the first axis intersects the second axis at an angle of between 90° and 170°.

In some embodiments, the first dielectric substrate and the second dielectric substrate may be a single dielectric substrate that is mounted on an upper surface of the thermally conductive flange, the dielectric substrate including an interior opening.

In some embodiments, the first dielectric substrate and the second dielectric substrate may each be ceramic substrates that are mounted on an upper surface of the thermally conductive flange In some embodiments, the dielectric substrate may be a dielectric layer of a printed circuit board and the interior opening may be an interior opening in the printed circuit board.

In some embodiments, the first axis may intersect the second axis at an angle of between 100° and 160°, at an angle of between 110° and 150°, or at an angle of between 120° and 140°.

In some embodiments, the RF amplifier may further include a first input impedance matching capacitor die that is mounted on the upper surface of the thermally conductive flange and a plurality of first bond wires that electrically connect the first input impedance matching capacitor die to the first RF amplifier die. In some embodiments, respective heights of the first bond wires may monotonically decrease the closer the respective first bond wires are to the center of the thermally conductive flange.

In some embodiments, a longitudinal axis of the first input impedance matching capacitor die may extend along a third axis, and the first axis may intersect the third axis at an angle of between 5° and 45° or at an angle of between 15° and 35°.

In some embodiments, the RF amplifier may further include a first output impedance matching capacitor die that is mounted on the upper surface of the thermally conductive flange within the interior opening in the printed circuit board and electrically connected to the first RF amplifier die, where a longitudinal axis of the first output impedance matching capacitor die defines a fifth axis, and the fifth axis intersects a first outer sidewall of the printed circuit board at an angle of between 45° and 80°. In some embodiments, the interior opening in the printed circuit board may include a first inner sidewall that is adjacent an input side of the RF amplifier die and a second inner sidewall that is opposite the first inner sidewall and that is adjacent an output side of the RF amplifier die, and a length of the second inner sidewall may be at least 1.3 times greater than a length of the first inner sidewall.

In some embodiments, the first dielectric substrate and the second dielectric substrate may be plastic substrates having metallization thereon, and the RF amplifier may further include at least one input flange that extends between the first dielectric substrate and the thermally conductive flange and at least one output flange that extends between the thermally conductive flange and the second dielectric substrate.

Pursuant to further embodiments of the present invention, RF amplifiers are provided that include a submount, an RF amplifier die mounted on the submount, a longitudinal axis of the RF amplifier die defining a first axis, an input impedance matching capacitor die that is mounted on the upper surface of the submount, a longitudinal axis of the input impedance matching capacitor die defining a third axis, and a plurality of bond wires that electrically connect the input impedance matching capacitor die to the RF amplifier die. An angle defined by the intersection of the first axis and the third axis is between 5° and 45°.

In some embodiments, the RF amplifier may further include a printed circuit board having an interior opening mounted on an upper surface of the submount, where the RF amplifier die and the input impedance matching capacitor die are both within the interior opening in the printed circuit board.

In some embodiments, respective heights of the plurality of bond wires may decrease the closer the bond wires are to the center of the submount.

In some embodiments, the RF amplifier may further include a second RF amplifier die that has a longitudinal axis that defines a second axis, where the first and second axes intersect at an angle of between 90° and 170°.

In some embodiments, the RF amplifier may further include a first dielectric substrate with conductive paths thereon on a first side of the RF amplifier die, a second dielectric substrate with conductive paths thereon on a second side of the RF amplifier die that is opposite the first side, at least one input flange that extends between the first dielectric substrate and the submount, and at least one output flange that extends between the submount and the second dielectric substrate.

Pursuant to additional embodiments of the present invention, RF amplifiers are provided that include a submount, a dielectric substrate mounted on an upper surface of the submount, the dielectric substrate including an interior opening, an RF amplifier die mounted on the upper surface of the submount within the interior opening in the dielectric substrate, an input impedance matching capacitor die mounted on the upper surface of the submount within the interior opening in the dielectric substrate, and a plurality of bond wires that electrically connect the input impedance matching capacitor die to the RF amplifier die. Respective heights of the plurality of bond wires above the submount decrease the closer each bond wire is to the center of the submount.

In some embodiments, all of the bond wires may have substantially a same inductance.

In some embodiments, respective lengths of the bond wires may be substantially equal.

In some embodiments, a longitudinal axis of the RF amplifier die defines a first axis and a longitudinal axis of the input impedance matching capacitor die defines a third axis, and the first axis may intersect the third axis at an angle that is greater than 10° and/or at an angle that is less than 45°.

In some embodiments, the dielectric substrate may be a dielectric layer of a printed circuit board.

Pursuant to yet additional embodiments of the present invention, RF amplifiers are provided that include a thermally conductive flange, a dielectric substrate mounted on an upper surface of the thermally conductive flange, the dielectric substrate including an interior opening and an RF amplifier die mounted on the upper surface of the thermally conductive flange within the interior opening in the dielectric substrate. The interior opening in the dielectric substrate is substantially non-rectangular in shape.

In some embodiments, the RF amplifier may further include an input impedance matching capacitor die that is mounted on the upper surface of the thermally conductive flange within the interior opening in the dielectric substrate.

In some embodiments, a longitudinal axis of the RF amplifier die defines a first axis and a longitudinal axis of the input impedance matching capacitor die defines a third axis, where the first axis intersects the third axis at an angle of between 5° and 45°.

In some embodiments, the RF amplifier may further include a plurality of bond wires that electrically connect the input impedance matching capacitor die to the RF amplifier die, where a maximum height of a first of the bond wires above the upper surface of the thermally conductive flange is less than a maximum height of a second of the bond wires above the upper surface of the thermally conductive flange.

The respective heights of the plurality of bond wires may decrease the closer the bond wires are to the center of the thermally conductive flange.

In some embodiments, the RF amplifier may further include an output impedance matching capacitor die that is mounted on the upper surface of the thermally conductive flange within the interior opening in the dielectric substrate, where a longitudinal axis of the output impedance matching capacitor die defines a fifth axis, and the fifth axis intersects a first outer sidewall of the dielectric substrate at an angle of between 45° and 80°.

In some embodiments, the interior opening in the dielectric substrate may include a first inner sidewall that is adjacent an input side of the RF amplifier die and a second inner sidewall that is opposite the first inner sidewall and that is adjacent an output side of the RF amplifier die, and a length of the second inner sidewall may be at least 1.3 times greater than a length of the first inner sidewall.

In some embodiments, the first inner sidewall may be substantially straight and the second inner sidewall includes at least two segments that may be angled with respect to each other.

Pursuant to yet further embodiments of the present invention, RF amplifiers are provided that include a printed circuit board and a plurality of packaged integrated circuit die mounted on or in the printed circuit board, the packaged integrated circuit die including an RF amplifier die and an impedance matching capacitor die that is electrically connected to the RF amplifier die, where a longitudinal axis of the RF amplifier die defines a first axis and a longitudinal axis of the impedance matching capacitor die defines a second axis that intersects the first axis at an oblique angle.

In some embodiments, the impedance matching capacitor die may be an input impedance matching capacitor die.

In some embodiments, the RF amplifier may further include a plurality of first bond wires that electrically connect the input impedance matching capacitor die to the RF amplifier die, where a maximum height of a first of the first bond wires above the upper surface of the submount is less than a maximum height of a second of the first bond wires above the upper surface of the submount.

In some embodiments, all of the first bond wires may have substantially a same inductance In some embodiments, the first of the first bond wires may be closer to a center of the submount than is the second of the first bond wires.

In some embodiments, the RF amplifier may further include an output impedance matching capacitor die that is mounted on or in the printed circuit board and that is electrically connected to the RF amplifier die, and a longitudinal axis of the output impedance matching capacitor die may define a third axis, and the third axis may intersects the first axis at an angle of between 30° and 60°.

BRIEF DESCRIPTION OF THE DRAWINGS

FIG. 1 is a block diagram of an RF amplifier that includes input and output impedance matching circuits.

FIG. 2A is a schematic plan view of a conventional implementation of the RF amplifier of FIG. 1 with a lid of the package removed.

FIG. 2B is a schematic side view of the RF amplifier of FIG. 2A.

DETAILED DESCRIPTION

Figure 2C:
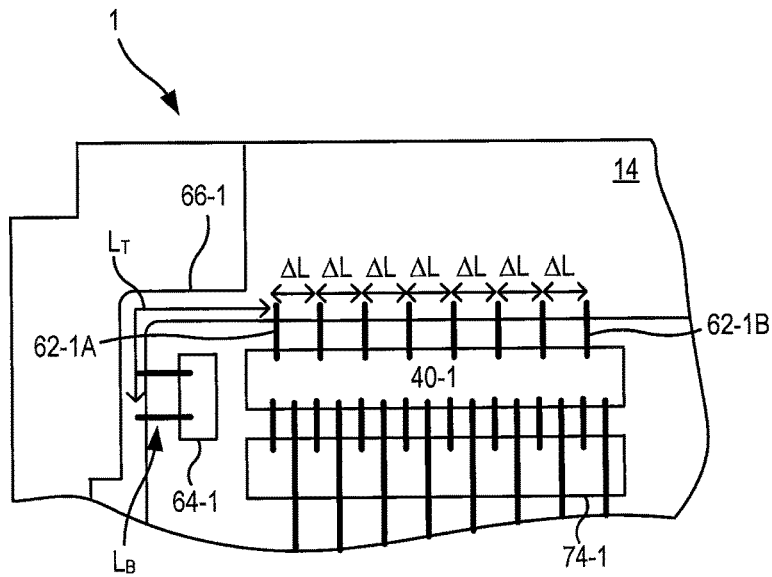
FIG. 2C is an enlarged view of a portion of FIG. 2A.

Pursuant to embodiments of the present invention, RF amplifiers are provided that include RF amplifier dies and/or impedance matching capacitor dies that are placed in unorthodox locations within the RF amplifier package. The placement of these die may be selected to improve one or more performance parameters of the RF amplifier. For example, in some applications, the best impedance matching performance may be achieved if the inductance included in a shunt impedance matching circuit is kept below a certain value. This may be difficult to achieve in some cases using conventional die placement. However, by angling the dies in unconventional ways, it is possible to reduce the inductance in the shunt impedance matching circuit without otherwise negatively impacting the performance of the RF amplifier.

In one embodiment of the invention, RF amplifiers are provided that include a submount such as a thermally conductive flange. A plurality of packaged integrated circuit die are mounted on the submount. The packaged integrated circuit die include an RF amplifier die and an input impedance matching capacitor die that is electrically connected to the RF amplifier die. A longitudinal axis of the RF amplifier die is not parallel with a longitudinal axis of the impedance matching capacitor die. The RF amplifier may further include an output impedance matching capacitor die that is mounted on the upper surface of the submount, where a longitudinal axis of the output impedance matching capacitor die is also not parallel with either the longitudinal axis of the RF amplifier die or the longitudinal axis of the input impedance matching capacitor die.

In other embodiments, RF amplifiers are provided that include a thermally conductive flange and a dielectric substrate that includes an interior opening mounted on an upper surface of the thermally conductive flange. An RF amplifier die is mounted on the upper surface of the thermally conductive flange within the interior opening in the dielectric substrate. The interior opening in the dielectric substrate has an asymmetric shape when viewed from above. For example, the shape of the opening in the dielectric substrate may not be centrosymmetric when viewed from above, where a shape is centrosymmetric when viewed from above if every point (x, y) of the shape has a corresponding point (−x, −y) with respect to an x-y coordinate system centered at the center of the shape.

In other embodiments of the invention, RF amplifiers are provided that include a submount such as a thermally conductive flange. A dielectric substrate such as, for example, a ceramic substrate or a dielectric layer of a printed circuit board is mounted on an upper surface of the submount, the dielectric substrate having a first outer sidewall, a second outer sidewall that is opposite and substantially parallel to the first outer sidewall, and an interior opening. Conductive leads are provided on the dielectric substrate, such as a lead frame when the dielectric substrate is a ceramic substrate or conductive traces when the dielectric substrate is a dielectric layer of a printed circuit board. An RF amplifier die is mounted on the submount within the interior opening of the dielectric substrate, where a longitudinal axis of the RF amplifier die defines a first axis. The RF amplifier die is positioned so that a first angle defined by the intersection of the first axis with the first outer sidewall is between 5° degrees and 45°.

In still other embodiments, RF amplifiers are provided that include a thermally conductive flange. First and second RF amplifier dies are mounted on the thermally conductive flange. An input section to the RF amplifier that comprises a first dielectric substrate with conductive paths thereon is provided on a first side of the first and second RF amplifier dies, and an output section that comprises a second dielectric substrate with conductive paths thereon is provided on a second side of the first and second RF amplifier dies, the second side being opposite the first side. In this embodiment, a longitudinal axis of the first RF amplifier die defines a first axis and a longitudinal axis of the second RF amplifier die defines a second axis, where the first axis intersects the second axis at an angle of between 90° and 170°.

In further embodiments, RF amplifiers are provided that include a submount. An RF amplifier die is mounted on the submount, where a longitudinal axis of the RF amplifier die defines a first axis. An input impedance matching capacitor die is also mounted on the submount, a longitudinal axis of the input impedance matching capacitor die defining a third axis. A plurality of bond wires electrically connect the input impedance matching capacitor die to the RF amplifier die. A first angle defined by the intersection of the first axis and the third axis is between 5° degrees and 45°

In still other embodiments, RF amplifiers are provided that include a thermally conductive flange and a dielectric substrate that includes an interior opening that is mounted on an upper surface of the thermally conductive flange. An RF amplifier die is mounted within the interior opening in the dielectric substrate. The interior opening in the dielectric substrate is substantially non-rectangular in shape.

In yet other embodiments, RF amplifiers are provided that include a submount and a dielectric substrate that includes an interior opening that is mounted on an upper surface of the submount. The RF amplifier further includes both an RF amplifier die and an input impedance matching capacitor die, both of which are mounted on the submount within the interior opening in the dielectric substrate. A plurality of input matching inductive bond wires electrically connect the input impedance matching capacitor die to the RF amplifier die. Respective heights of the plurality of input matching inductive bond wires decrease the closer each input matching inductive bond wire is to the center of the submount.

In additional embodiments, RF amplifiers are provided that include a printed circuit board and a plurality of packaged integrated circuit die mounted on or in the printed circuit board, the packaged integrated circuit die including an RF amplifier die and an impedance matching capacitor die that is electrically connected to the RF amplifier die. A longitudinal axis of the RF amplifier die defines a first axis and a longitudinal axis of the impedance matching capacitor die defines a second axis that intersects the first axis at an oblique angle.

Embodiments of the present invention will now be discussed in further detail with reference to the accompanying figures.

As noted above, RF amplifiers often include input and/or output impedance matching circuits. In many applications, shunt impedance matching circuits may be used that include one or more reactive components that are coupled to electrical ground. FIG. 1 is a block diagram of an RF amplifier 1 that includes both input and output impedance matching circuits. As shown in FIG. 1, the RF amplifier 1 includes a package 3 that has an RF amplifier die 40 mounted therein. An RF input 12 may extend from or otherwise be located on a first side of the package 3 and an RF output 14 may extend from or otherwise be located on, for example, a second side of the package 3. An input impedance matching network 50 may be coupled between the RF input 12 and an input port 42 of the RF amplifier die 40, and an output impedance matching network 60 may be coupled between an output port 44 of the RF amplifier die 40 and the RF output 14.

FIG. 2A is a schematic plan view of a conventional implementation of the RF amplifier 1 of FIG. 1 with an optional lid 2 of the package thereof removed. FIG. 2B is a schematic side view of the RF amplifier 1 with the lid 2 in place. As shown in FIGS. 2A and 2B, the RF amplifier 1 may include a submount 10 which may comprise, for example, a metal flange, a printed circuit board 20 that is mounted on the submount 10, and the lid 2 that is mounted on the printed circuit board 20 opposite the submount 10. The submount 10, printed circuit board 20 and lid 2 may comprise the package of the RF amplifier 1.

Referring to FIG. 2A, the printed circuit board 20 comprises a dielectric substrate 22 that has first and second metallized regions 24, 26 on the upper surface thereof. The first metallized region 24 forms an RF input 12 for the RF amplifier 1, and the second metallized region 26 forms an RF output 14 for the RF amplifier 1. A bottom surface of the printed circuit board 20 may also include one or more metallized regions (not shown) that may, in combination with the dielectric substrate 22 and the first and second metallized regions 24, 26, form microstrip transmission lines. The printed circuit board 20 further includes an interior opening 28 that exposes the upper surface of the submount 10 where the dielectric substrate 22 (and any metallization) is removed.

RF amplifier dies 40-1, 40-2 are mounted on the submount 10 within the interior opening 28 in the printed circuit board 20. Each RF amplifier die 40-1, 40-2 includes a respective RF input 42-1, 42-2 and a respective RF output 44-1, 44-2. Six capacitor dies that are part of the input and output impedance matching networks or harmonic termination networks are also mounted within the interior opening 28 in the printed circuit board 20 in the example RF amplifier 1 shown in FIG. 2A. It will be appreciated, of course, that different numbers of RF amplifier dies and/or capacitor dies may be included in other embodiments.

The RF amplifier 1 includes two amplification circuits that are implemented in parallel. It will be appreciated that the right side of RF amplifier 1 is identical to the left side, and hence the description below will only describe the components on the left side of the RF amplifier 1, and it will be appreciated that the right side of the RF amplifier die 1 includes the exact same components connected in the exact same way. Two part reference numerals have been used to help highlight how the same circuit structure is implemented twice in RF amplifier 1.

The RF amplifier 1 further includes an input impedance matching network 50-1 that comprises a first set of bond wires 52-1, an input impedance matching capacitor die 54-1, and a second set of bond wires 56-1. First ends of the bond wires 52-1 are coupled to the RF input 12 and second ends of the bond wires 52-1 are coupled to first electrodes of capacitors included in the input impedance matching capacitor die 54-1. The second electrodes of the capacitors included in the input impedance matching capacitor die 54-1 are coupled to electrical ground via a connection that is not visible in FIG. 2A. The second set of bond wires 56-1 extend between the first electrodes of the capacitors included in the input impedance matching capacitor die 54-1 and the RF input 42-1 to RF amplifier die 40-1.

The RF amplifier 1 also includes an output impedance matching network 60-1 that comprises a third set of bond wires 62-1, an output impedance matching capacitor die 64-1, a conductive trace 66-1 on the printed circuit board 20, and a fourth set of bond wires 68-1. The third set of bond wires 62-1 extend between the output port 44-1 of the RF amplifier die 40-1 and the RF output 14. A first end of the conductive trace 66-1 is part of the second metallized region 26 that forms the RF output 14, as shown by the dashed line in FIG. 2A, and the conductive trace 66-1 extends laterally from the RF output 14 and has a 90° bend in order to run adjacent the output impedance matching capacitor die 64-1. The bond wires 68-1 extend between the second end of the conductive trace 66-1 and the first electrodes of capacitors included in the output impedance matching capacitor die 64-1. The second electrodes of the capacitors included in the output impedance matching capacitor die 64-1 are coupled to electrical ground via a connection that is not visible in FIG. 2A.

The RF amplifier 1 further includes a harmonic termination circuit 70-1 that includes a fifth set of bond wires 72-1 and a harmonic termination capacitor die 74-1. The bond wires 72-1 are coupled between the input port 42-1 of RF amplifier die 40-1 and first electrodes of capacitors included in the first harmonic termination capacitor die 74-1. The second electrodes of the capacitors included in the first harmonic termination die 74-1 are coupled to electrical ground. While circuit 70-1 is a harmonic termination circuit in the embodiment of FIG. 2A, it will be appreciated that in other embodiments the circuit 70-1 may be some other type of matching element, or may be omitted.

Figure 3:
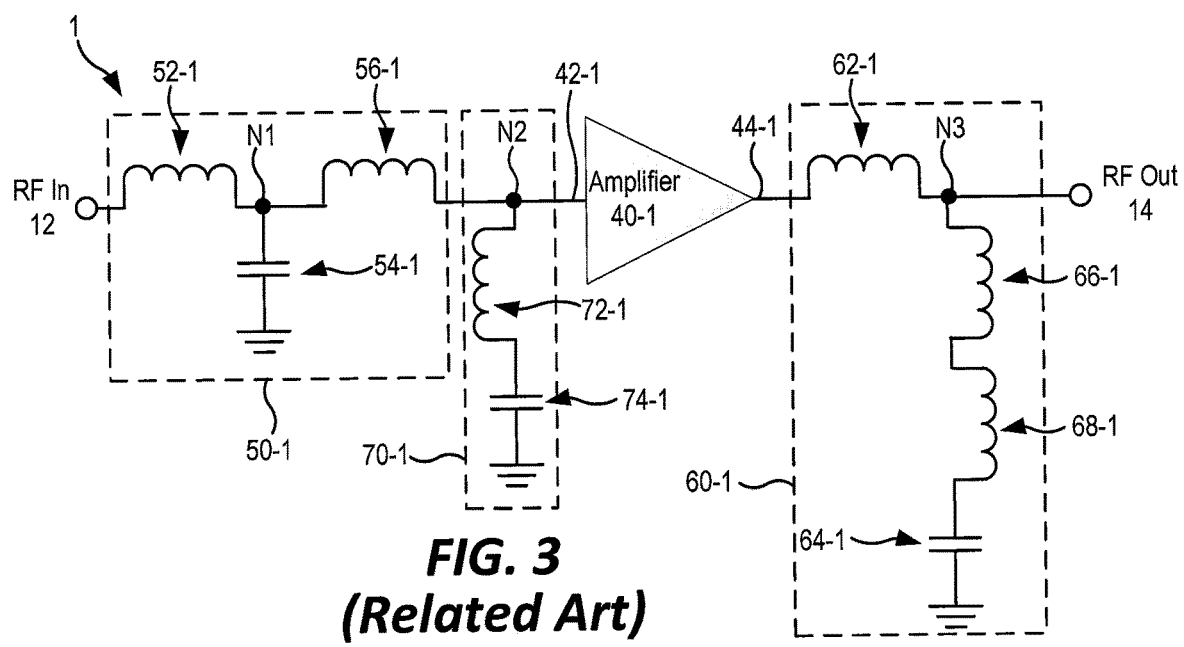
FIG. 3 is a circuit diagram of the RF amplifier of FIGS. 2A-2B.

FIG. 3 is a circuit diagram of the left side of the RF amplifier 1 of FIGS. 2A-2B. As shown in FIG. 3, the first set of bond wires 52-1 act as a series inductance that is connected to the RF input 12. The input impedance matching capacitor die 54-1 acts as a shunt capacitance that is coupled to ground. The second set of bond wires 56-1 act as a second series inductance that extends between a node N1 and a node N2 at the input port 42-1 to the RF amplifier die 40-1. The fifth set of bond wires 72-1 and the harmonic termination capacitor die 74-1 are coupled in series between the input port 42-1 to the RF amplifier die 40-1 and electrical ground. The third set of bond wires 62-1 act as a series inductance that is connected between the output port 44-1 of the RF amplifier die 40-1 and a node N3 that corresponds to the RF output 14 of the RF amplifier 1. The conductive trace 66-1 and the second set of bond wires 68-1 are coupled together in series and along with the output impedance matching capacitor die 64-1 form the remainder of output impedance matching network 60-1 as a shunt circuit that extends between node N3 and electrical ground.

As noted above, in some applications, providing only a small amount of inductance in the output impedance matching circuit may provide the best output impedance match. However, any conductive path has an inherent inductance, which generally increases with the length of the conductive path. As such, as discussed above with reference to FIG. 3, the electrical connections such as the conductive trace 66-1 and the various sets of bond wires act as inductors, and due to the necessary physical separation between the various dies, these "inductors" may ultimately inject more than a desired amount of inductance. Referring again to FIG. 2A, it can be seen that the conductive traces 66-1, 66-2 not only extend parallel to the respective RF amplifier dies 40-1, 40-2, but also include 90° bends and extend further to provide respective pads for connecting the bond wires 68-1, 68-2 that extend between the conductive traces 66-1, 66-2 and the respective output impedance matching capacitor dies 64-1, 64-2. As a result, the combined inductance 62-1, 66-1, 68-1 illustrated in the circuit diagram of FIG. 3 may be too high in many applications, which may degrade the output impedance match of RF amplifier 1, and hence the operating bandwidth at which optimum performance (e.g., efficiency, power, gain) can be achieved.

Additionally, the RF amplifier dies 40-1, 40-2 typically include a plurality of transistor blocks that are electrically connected in parallel, where each transistor block has a plurality of +(mit cell transistors (e.g., 5-20) that are likewise electrically connected in parallel. Referring to FIG. 2C, which is an enlarged view of a portion of FIG. 2A, the unit cell transistors in RF amplifier die 40-1 that are near the left side of the die will "see" a first level of inductance in the output impedance matching circuit 60-1 that is equal to the sum of the inductance of the bond wire 62-1A (which is the bond wire closest to these unit cells), the inductance of the portion of the conductive trace 66-1 that is between bond wire 62-1A and the inductance of the bond wires 68-1 that connect conductive trace 66-1 to output impedance matching capacitor die 64-1. In contrast, the unit cell transistors in RF amplifier die 40-1 that are near the right side of the die (e.g., bond wire 62-1B) will see a second, higher level of inductance in the output impedance matching circuit 60-1 that is equal to the sum of the inductance of the bond wire 62-1B, the inductance of nearly the entire conductive trace 66-1, and the inductance of the bond wires 68-1 that connect conductive trace 66-1 to output impedance matching capacitor die 64-1. This is shown schematically in FIG. 2C, which shows that in the case where eight bond wires extend between the RF amplifier die 40-1 and conductive trace 66-1 that are each separated by a distance ΔL, the inductance of the output impedance matching network 60-1 seen by the different transistor blocks is:

$$L_{OIM} = L_T + L_B + x \cdot \Delta L,$$

where x is an integer between 1 and 7 depending upon the physical location of the transistor block within the RF amplifier die 40-1.

This means that different unit cell transistors are impedance matched differently, and such a "distributed" match tends to negatively affect the impedance matching on the output. At lower frequencies (e.g., frequencies under 2 GHz), the effect of the variation in inductance in the output impedance matching circuit 60-1 is typically fairly small (e.g., it may result in a 2-3% loss in efficiency). However, the efficiency loss may increase dramatically at higher frequencies; for example, at 3.5 GHz, an efficiency loss of 10-15% may be more common. Thus, the output impedance match may be less than ideal because (1) the average value of the inductance in the output impedance matching circuit 60-1 may be too large and (2) the variation in the value of the inductance further degrades the impedance match.

Pursuant to embodiments of the present invention, the conventional arrangement of the various dies shown in FIG. 2A may be changed in order to reduce the amount of inductance in, for example, the output impedance matching networks 60-1, 60-2. This may allow for better impedance matching and hence improved amplifier performance.

Figure 4A:
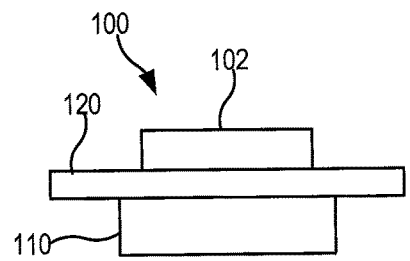
FIG. 4A is a schematic side view of an RF amplifier according to embodiments of the present invention.
Figure 4B:
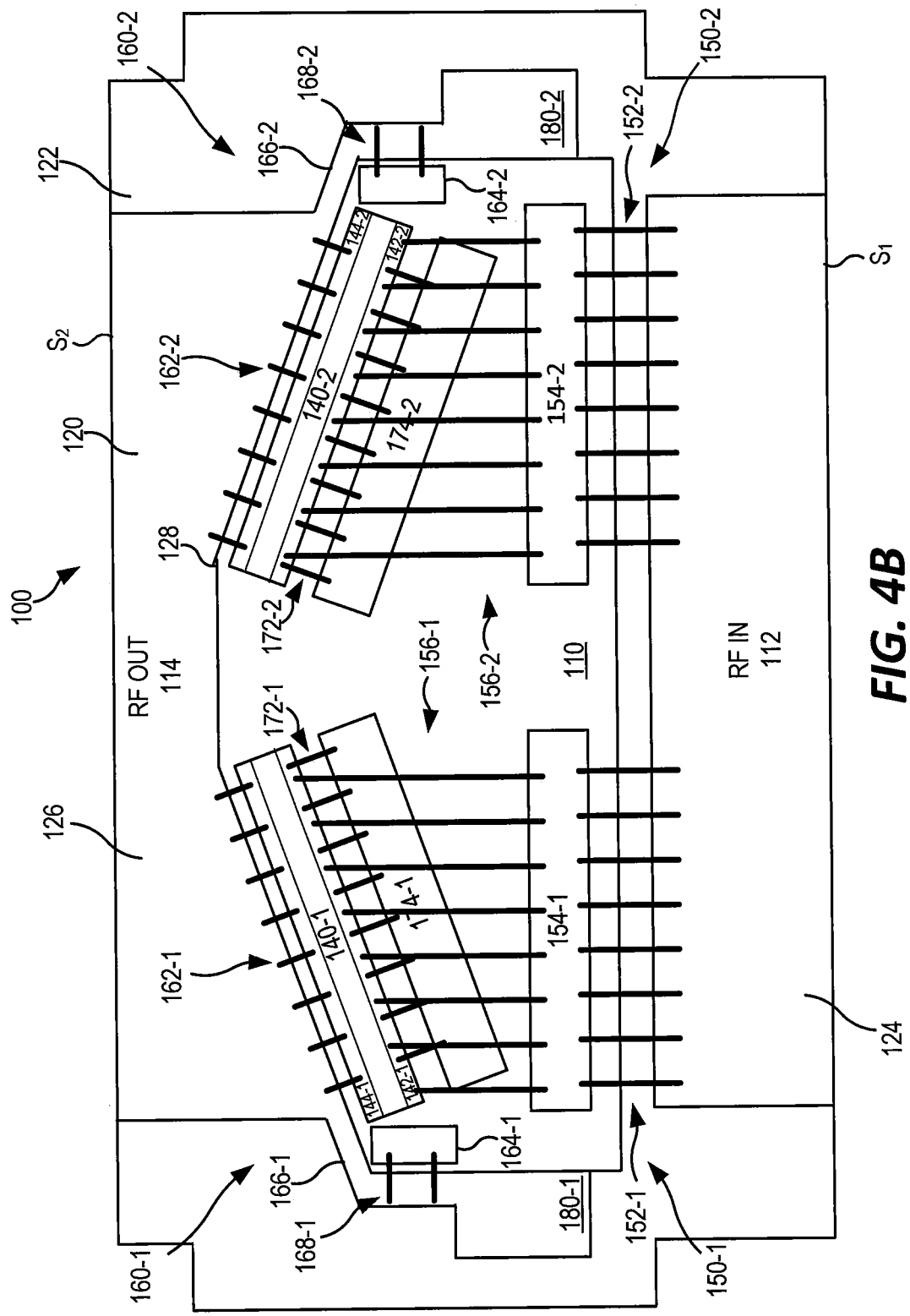
FIG. 4B is a schematic plan view of the RF amplifier of FIG. 4A with the lid removed.

FIGS. 4A and 4B illustrate an RF amplifier 100 according to embodiments of the present invention. In particular, FIG. 4A is a schematic side view of the RF amplifier 100, while FIG. 4B is a schematic plan view of the RF amplifier 100 with a lid 102 of the package removed. As with RF amplifier 1 discussed above, RF amplifier 100 includes two amplification circuits that are implemented in parallel, and thus the same circuit structure is provided on both the right and left side of the RF amplifier 100. Accordingly, the discussion below will focus on the components on the left side of the RF amplifier 100.

As shown in FIG. 4A, the RF amplifier 100 includes a baseplate or "submount" 110, a printed circuit board 120 that is mounted on the submount, and an optional lid 102 that is mounted on the printed circuit board 120 opposite the submount 110. The submount 110 may take the form of a thermally conductive (e.g., copper) flange in an example embodiment. The submount 110, printed circuit board 120 and lid 102 may comprise the package of the RF amplifier 100. Some RF amplifiers according to embodiments of the present invention may have any of the package designs disclosed in U.S. Pat. No. 8,907,467, the entire content of which is incorporated herein by reference.

Referring to FIG. 4B, the printed circuit board 120 has a first outer sidewall $S_1$ and a second outer sidewall $S_2$ that is opposite the first outer sidewall $S_1$. The printed circuit board 120 comprises a dielectric substrate 122 that has first and second metallized regions 124, 126 on the upper surface thereof. The first metallized region 124 forms an RF input 112 for the RF amplifier 100, and the second metallized region 126 forms an RF output 114 for the RF amplifier 100. A bottom surface of the printed circuit board 120 may also include one or more metallized regions (not shown) that may, in combination with the dielectric substrate 122 and the first and second metallized regions 124, 126, form microstrip transmission lines. In this particular embodiment, the metallized regions 124, 126 on the printed circuit board 120 serve as the "leads" for the RF amplifier 100. It will be appreciated that in other embodiments metal pins or other more conventional leads may alternatively be used as the RF input and/or the RF output. The printed circuit board 120 further includes an interior opening 128 where the dielectric substrate 122 (and any metallization) is removed that exposes the upper surface of the submount 110. While in the depicted embodiment the interior opening 128 comprises a single large opening, it will be appreciated that in other embodiments the interior opening 128 may comprise multiple smaller openings.

As with the conventional RF amplifier discussed above, first and second RF amplifier dies 140-1, 140-2 are mounted within the interior opening 128 in the printed circuit board 120. The source side of the RF amplifier dies 140 may be physically attached to a die attach region of the submount 110, and may be electrically connected to the submount 110. The printed circuit board 120 isolates the source of each RF amplifier die 140 from the gates and drains thereof, which are disposed at the opposite side of each RF amplifier die 140 from the source. The RF amplifier dies 140-1, 140-2 typically include a plurality of transistor blocks, where each transistor block includes a plurality of unit cell transistors. So-called gate resistors may be interposed between adjacent blocks. The unit cell transistors may be connected electrically in parallel. The transistors may comprise gallium nitride based high electron mobility transistors. Suitable designs for the RF amplifier dies 140 is provided, for example, in U.S. Pat. No. 9,947,616, issued Apr. 17, 2018, which is incorporated herein by reference.

The RF amplifier 100 further includes an input impedance matching network 150-1 that comprises a first set of bond wires 152-1, an input impedance matching capacitor die 154-1, and a second set of bond wires 156-1. The input impedance matching capacitor die 154-1 is mounted on the submount 110 within the interior opening 128 in the printed circuit board 120. First ends of the bond wires 152-1 are coupled to the RF input 112 and second ends of the bond wires 152-1 are coupled to first electrodes of capacitors included in the first input impedance matching capacitor die 154-1. The second electrodes of the capacitors included in the input impedance matching capacitor die 154-1 are coupled to electrical ground. The second set of bond wires 156-1 extend between the first electrodes of the capacitors included in the input impedance matching capacitor die 154-1 and the RF input 142-1 to RF amplifier die 140-1.

The RF amplifier 100 also includes an output impedance matching network 160-1 that comprises a third set of bond wires 162-1, an output impedance matching capacitor die 164-1, a conductive trace 166-1 on the printed circuit board 120, and a fourth set of bond wires 168-1. The output impedance matching capacitor die 164-1 is mounted on the submount 110 within the interior opening 128 in the printed circuit board 120. The third set of bond wires 162-1 extend between the output port 144-1 of the RF amplifier die 140-1 and the RF output 114. A first end of the conductive trace 166-1 is part of the second metallized region 126 that forms the RF output 114, and the conductive trace 166-1 extends from the RF output 114 and has a bend in order to run adjacent the output impedance matching capacitor die 164-1. The bond wires 168-1 extend between the second end of the conductive trace 166-1 and the first electrodes of capacitors included in the output impedance matching capacitor die 164-1. The second electrodes of the capacitors included in the output impedance matching capacitor die 164-1 are coupled to electrical ground.

The RF amplifier 100 may further include a harmonic termination circuit 170-1 that includes a fifth set of bond wires 172 and a harmonic termination capacitor die 174-1. The bond wires 172-1 are coupled between the input port 142-1 of RF amplifier die 140-1 and first electrodes of capacitors included in the first harmonic termination capacitor die 174-1. The second electrodes of the capacitors included in the first harmonic termination capacitor die 174-1 are coupled to electrical ground. While circuit 170-1 is a harmonic termination circuit in the embodiment of FIGS. 4A-4B, it will be appreciated that in other embodiments the circuit 170-1 may be some other type of matching element, or may be omitted.

A drain pad 180-1 is connected to a drain lead (not shown). The drain pad 180-1 is electrically connected to the conductive trace 166-1.

Figure 5:
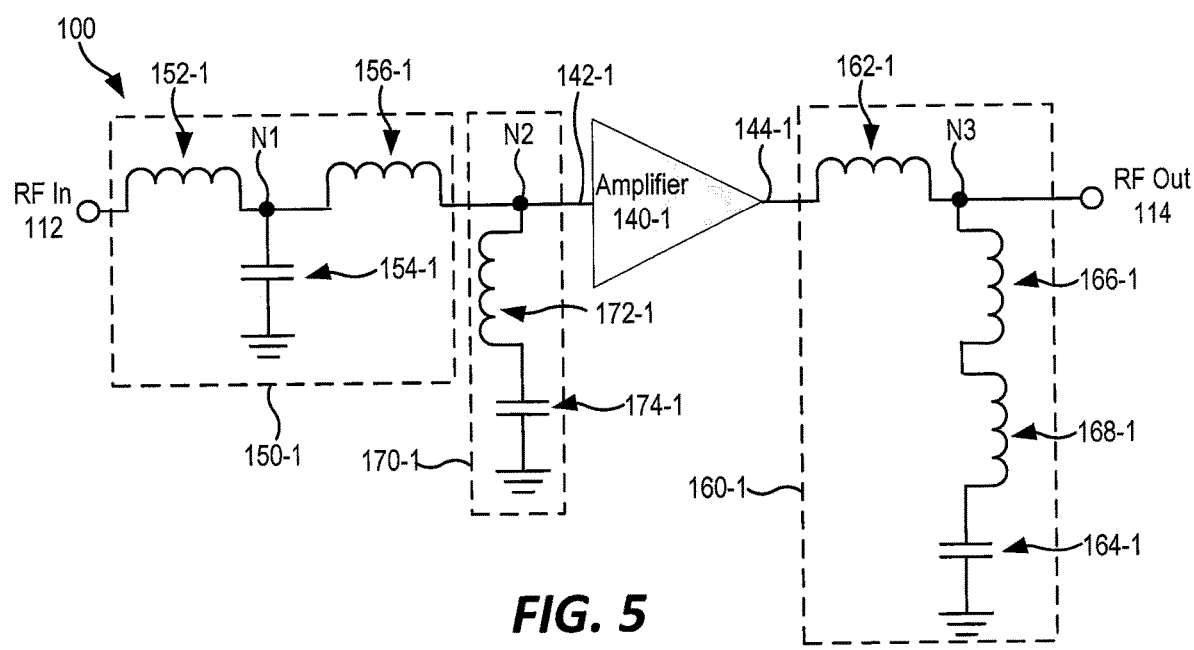
FIG. 5 is a circuit diagram of the RF amplifier of FIGS. 4A-4B.

FIG. 5 is a circuit diagram of the left side of the RF amplifier 100 of FIGS. 4A-4B. As shown in FIG. 5, the first set of bond wires 152-1 act as a series inductance that is connected to the RF input 112. The input impedance matching capacitor die 154-1 acts as a shunt capacitance that is coupled to ground. The second set of bond wires 156-1 act as a second series inductance that extends between a node N1 and a node N2 at the input port 142-1 to the RF amplifier die 140-1. The third set of bond wires 162-1 act as a series inductance that is connected between the output port 144-1 of the RF amplifier die 140-1 and a node N3 that corresponds to the RF output 114 of the RF amplifier 100. The conductive trace 166-1 and the third set of bond wires 168-1 are coupled together in series and along with the output impedance matching capacitor die 164-1 form the remainder of the output impedance matching network 160-1 as a shunt circuit that extends between a node N3 and electrical ground.

The fifth set of bond wires 172-1 and the harmonic termination capacitor die 174-1 are coupled in series between the input port 142-1 to the RF amplifier die 140-1 and electrical ground.

Figure 4C:
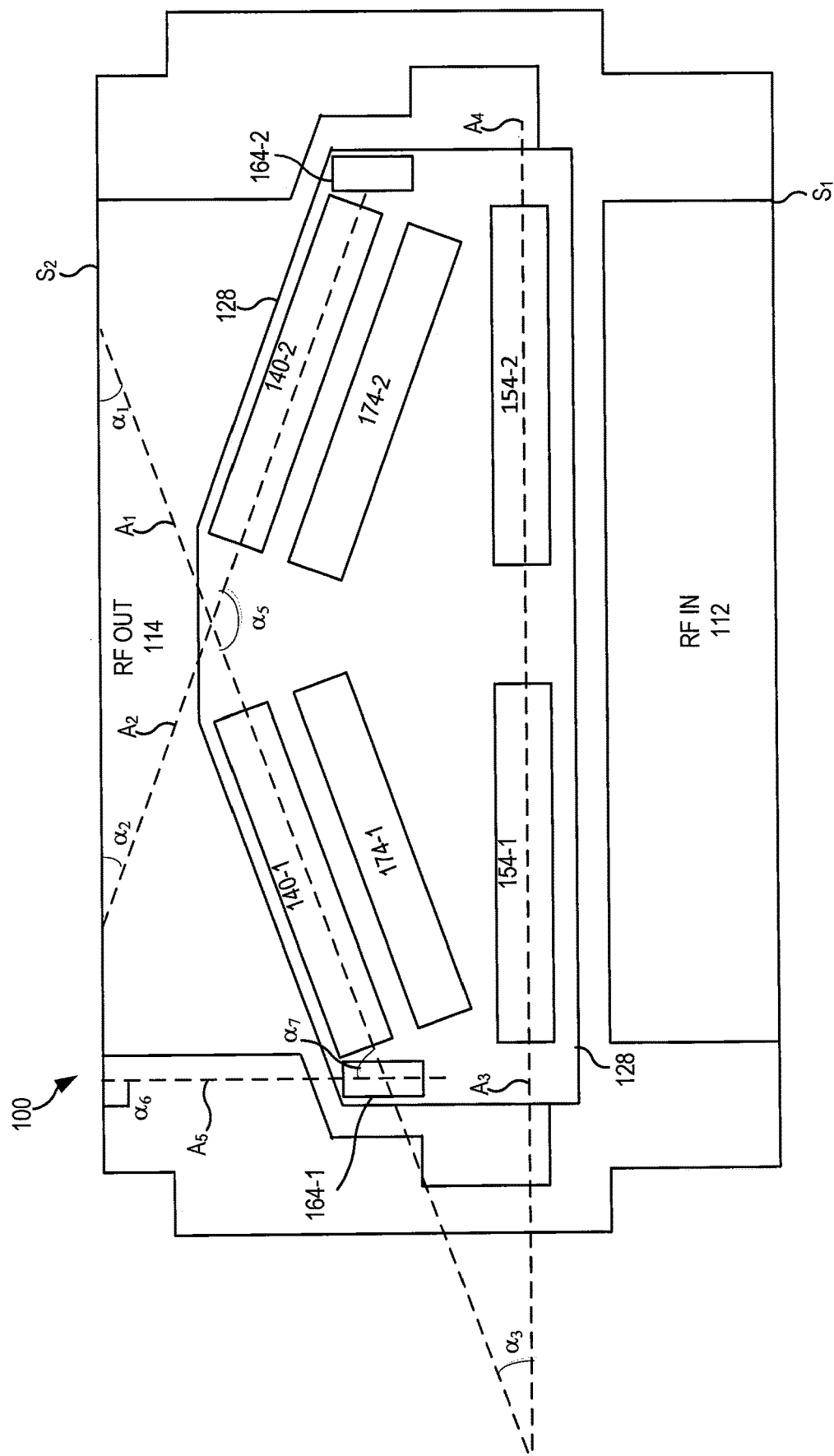
FIG. 4C is a simplified version of FIG. 4B that illustrates the angular relationships between various elements of the RF amplifier.

FIG. 4C is a simplified version of FIG. 4B that removes the bond wires to better illustrate the positions and orientations of the RF amplifier and capacitor dies included in RF amplifier 100. As shown in FIG. 4C, the RF amplifier dies 140-1, 140-2 are mounted at unorthodox orientations. In particular, RF amplifier die 140-1 is rotated counter-clockwise from the position shown in FIG. 2A by an angle of about 25°, while RF amplifier die 140-2 is rotated clockwise from the position shown in FIG. 2A by an angle of about 25°. The longitudinal axis of the first RF amplifier die 140-1 defines a first axis $A_1$, and the longitudinal axis of the second RF amplifier die 140-2 defines a second axis $A_2$. As is also shown in FIG. 4C, a first angle $\alpha_1$ that is defined by the intersection of the first axis $A_1$ with the second outer sidewall $S_2$ of the printed circuit board 120 is between 5° and 45°. A second angle $\alpha_2$ that is defined by the intersection of the second axis $A_2$ with the second outer sidewall $S_2$ of the printed circuit board 120 is also between 5° degrees and 45°. In other embodiments, the first angle $\alpha_1$ and/or the second angle $\alpha_2$ may be between 10° and 40°, between 15° and 35°, or between 20° and 30°.

In this embodiment, the input impedance matching capacitor dies 154-1, 154-2 are maintained in their conventional orientations (i.e., the positions shown in FIG. 2A) where the longitudinal axes thereof define respective third and fourth axes $A_3, A_4$ that extend generally parallel to the opposed first and second outer sidewalls $S_1, S_2$ of the printed circuit board 120 (and which may be collinear axes, as shown). A third angle $\alpha_3$ that is defined by the intersection of the first axis $A_1$ and the third axis $A_3$ is between 5° and 45°. Similarly, the longitudinal axis of input impedance matching capacitor die 154-2 defines a fourth axis $A_4$, and the second axis $A_2$ intersects the fourth axis $A_4$ at an angle $\alpha_4$ (not shown in FIG. 4C) that is of between 5° and 45°. In other embodiments, the third angle $\alpha_3$ and/or the fourth angle $\alpha_4$ may be between 10° and 40°, between 15° and 35°, or between 20° and 30°.

As is also shown in FIG. 4C, the first axis $A_1$ that is defined by the longitudinal axis of the first RF amplifier die 140-1 and the second axis $A_2$ that is defined by the longitudinal axis of the second RF amplifier die 140-2 intersect at a fifth angle $\alpha_5$ that is a right angle or an obtuse angle, such as an angle of between 90° and 170°. In other embodiments, the fifth angle $\alpha_5$ may be between 100° and 160°, between 110° and 150°, or between 120° and 140°.

As is further shown in FIG. 4C, the longitudinal axis of the first output impedance matching capacitor die 164-1 defines a fifth axis $A_5$. A sixth angle $\alpha_6$ that is defined by the intersection of the fifth axis $A_5$ with the first outer sidewall $S_1$ of the printed circuit board 120 is 90°. A seventh angle $\alpha_7$ that is defined by the intersection of the third axis $A_3$ and the fifth axis $A_5$ may be between 10° and 120° in example embodiments. In some embodiments, the seventh angle $\alpha_7$ may be between 30° and 60°.

As can also be seen in FIG. 4C, the interior opening 128 in the printed circuit board 120 may have a substantially non-rectangular shape in order to accommodate the angling of the RF amplifier dies 140-1, 140-2 from their conventional positions. In the depicted embodiment, the substantially rectangular conventional opening 28 shown in FIG. 2A is modified to be a substantially non-rectangular, six sided opening 128 that generally conforms to the positions of the dies mounted within the opening 128. As is also shown, the printed circuit board 120 includes a first inner sidewall (i.e., a sidewall of the interior opening 128) that is adjacent an input side of the RF amplifier die and a second inner sidewall that is opposite the first inner sidewall and that is adjacent an output side of the RF amplifier die. A length of the second inner sidewall is at least 1.3 times greater than a length of the first inner sidewall in some embodiments. The first inner sidewall is substantially straight and the second inner sidewall includes three segments that are angled with respect to each other.

As described above with respect to FIG. 2C, the inductance $L_T$ that occurs along a portion of the conductive trace 66-1 may be relatively large, and may result in the total amount of inductance included in the output impedance matching circuit 60-1 of conventional RF amplifier 1 being too large. As shown in FIG. 4C, by angling the RF amplifier die 140-1, the length of the conductive trace 166-1 may be reduced, resulting in less inductance. This may improve the performance of the RF amplifier 100.

Figure 4D:
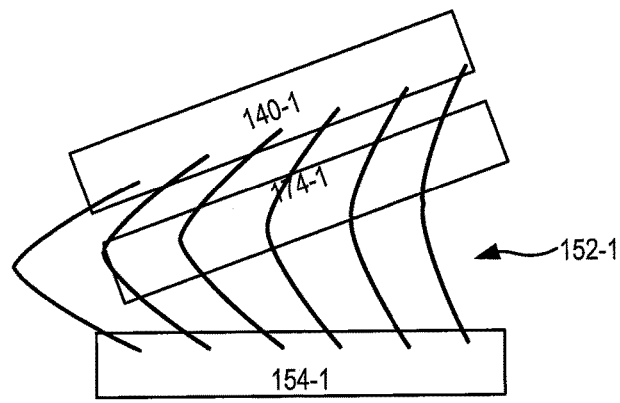
FIG. 4D is a schematic plan view of a portion of the RF amplifier of FIGS. 4A-4B that illustrates how bond wires of the input impedance matching network may have different heights.

As described above with respect to the output impedance matching network 60 included in the conventional RF amplifier 1 of FIG. 2, variation in the inductance of an impedance matching network that is seen by different unit cell transistors in the RF amplifier die tends to degrade the impedance match. In order to avoid any such variation in the inductance of the input impedance matching network 150-1, the bond wires 156-1 that connect the input impedance matching capacitor die 154-1 to the RF amplifier die 140-1 may all have the same length and cross-sectional area so that each bond wire 152-1 has substantially the same inductance. As shown schematically in FIG. 4D, this results in the ones of bond wires 152-1 that are closest to the middle of the RF amplifier 100 having low loop heights (i.e., the maximum height of the bond wire above the upper surface of the submount 110 is relatively small) while ones of the bond wires 152-1 that are closest to left side edges of the printed circuit board 120 have larger loop heights (i.e., the maximum height of the bond wire above the upper surface of the submount 110 is relatively large). In one specific embodiment, respective heights of the bond wires 152-1 above the upper surface of the submount 110 may decrease the closer the bond wires 152-1 are to the center of the submount 110 to accommodate the increasing distance between the input impedance matching capacitor die 154-1 and the RF amplifier die 140-1.

Figure 6:
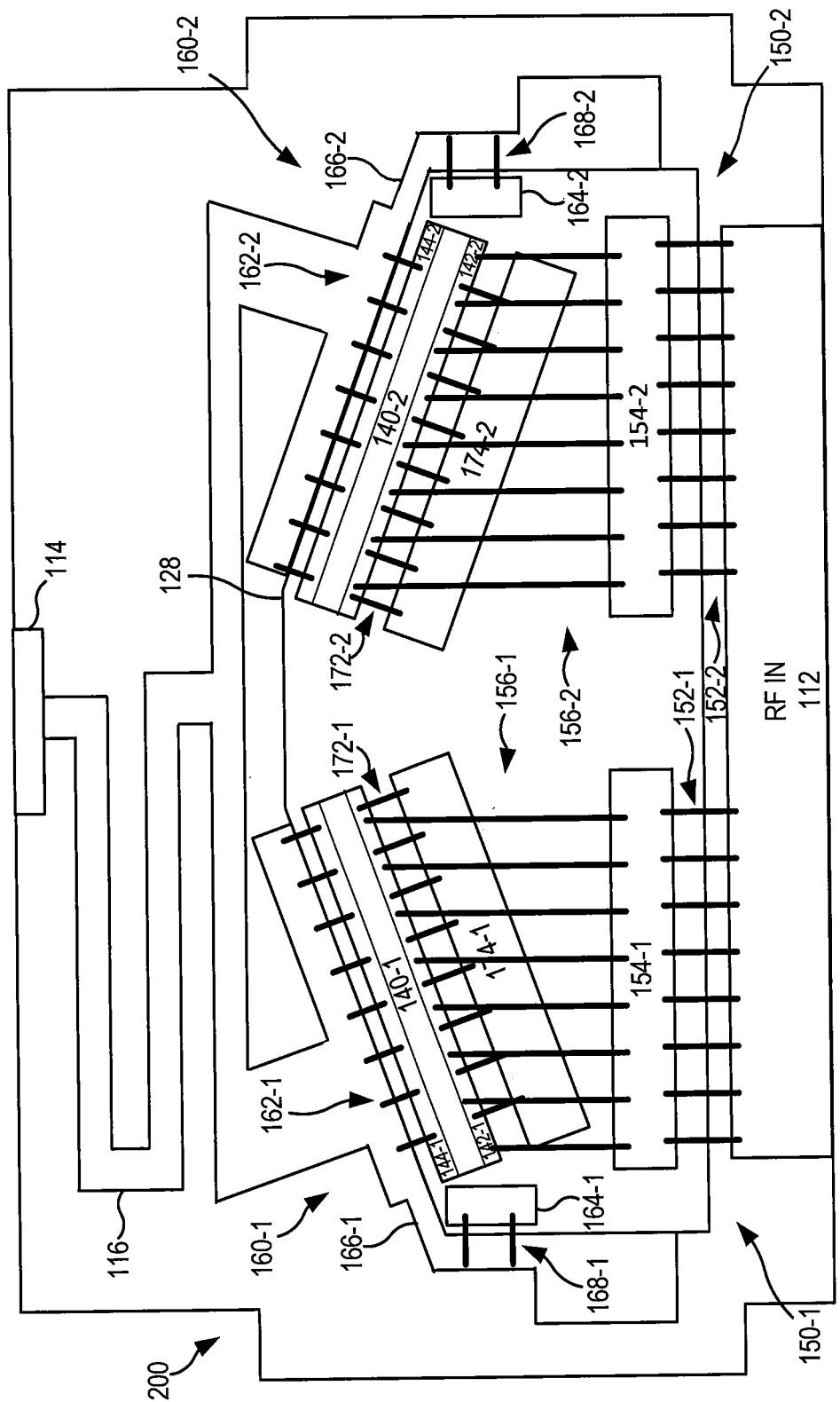
FIG. 6 is a schematic diagram of an RF amplifier according to further embodiments of the present invention.

FIG. 6 is a schematic diagram of a packaged RF amplifier 200 according to further embodiments of the present invention. The RF amplifier 200 is similar to the RF amplifier 100 of FIGS. 4A-4B, but RF amplifier 200 is a Doherty amplifier that includes both a peaking amplifier die 140-1 as well as a main amplifier die 140-2.

As shown in FIG. 6, the RF amplifier 200 may be configured similarly to the RF amplifier 100 of FIG. 4B, except that in RF amplifier 200 RF amplifier die 140-1 operates as a peaking amplifier while RF amplifier die 140-2 operates as a main amplifier die. The two amplifier dies 140-1, 140-2 may be biased differently. As the primary difference between RF amplifier 100 of FIG. 4B and RF amplifier 200 of FIG. 6 is that RF amplifier 200 includes parallel peaking and main amplifier dies 140-1, 140-2, further description of FIG. 6 is omitted.

One additional benefit of angling the RF amplifier dies in the manner discussed above is that it may provide additional room to extend the length of the RF transmission path between the RF amplifier dies 140-1, 140-2 and the RF output 114. As shown in FIG. 6, a meandering trace 116 is often used to connect the outputs of the RF amplifier dies 140-1, 140-2 to the RF output 114 in order to provide the required electrical length to phase the combining of the signals correctly in the Doherty amplifier design. By angling the RF amplifier dies 140-1, 140-2, it may be possible to extend the length of the meandering trace 116, if necessary, to achieve proper phasing of the signals. Additionally, angling the RF amplifier dies 140-1, 140-2 allows the output leads that connect to the meandering trace 116 to be angled outwardly, which may further increase the overall path length, if necessary.

Figure 7A:
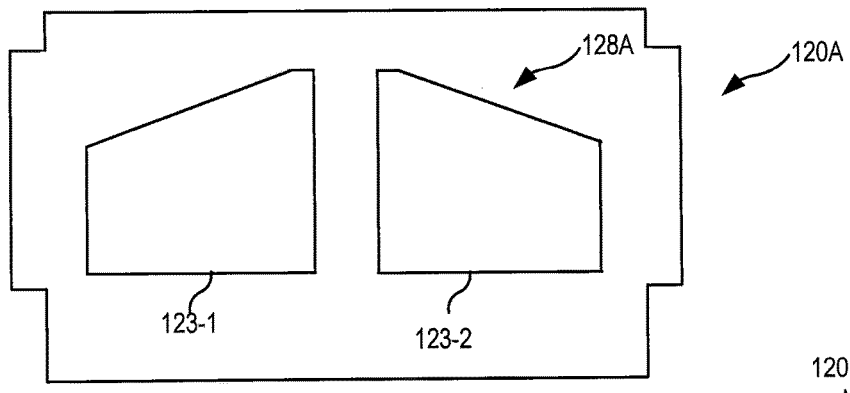
FIG. 7A-7C illustrate examples of the interior opening in the printed circuit board that may be included in RF amplifiers according to example embodiments of the present invention.
Figure 7B:
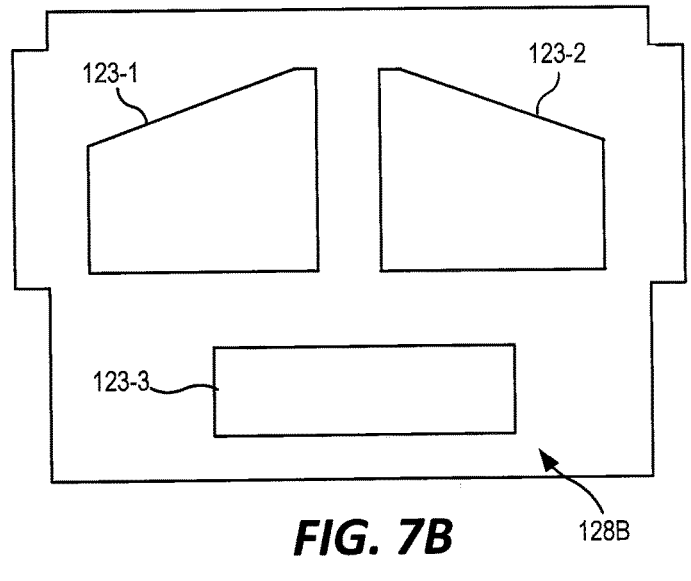
Figure 7C:
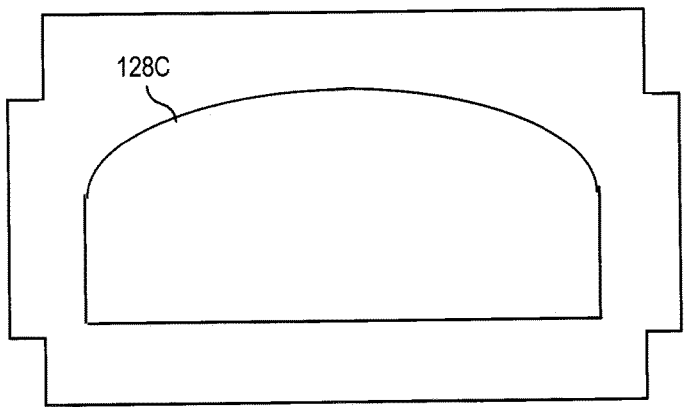

FIG. 7A-7C illustrate examples of the interior opening in the printed circuit board that may be included in RF amplifiers according to example embodiments of the present invention. As discussed above, some embodiments of the present invention may comprise RF amplifiers that have RF amplifier dies that are mounted within an interior opening in a printed circuit board, where the printed circuit board provides electrical connections between different components of the RF amplifier. FIGS. 7A-7C illustrate example interior openings. For example, FIG. 7A illustrates an interior opening 128A in a printed circuit board 120A that comprises first and second spaced apart openings 123-1, 123-2. Interior opening 128A could be used, for example, in place of the interior opening 128 shown in FIG. 4B. FIG. 7B illustrates an interior opening 128B in a printed circuit board 120B that may be well suited, for example, for use in RF amplifier designs that include a pre-driver stage, as it includes three openings 123-1 through 123-3 which may be used for three respective RF amplifier dies along with their associated harmonic termination and/or impedance match capacitor dies. FIG. 7C illustrates an interior opening 128C in a printed circuit board 120C that has a curved side rather than all straight sides.

While embodiments of the present invention have been discussed above with respect to RF amplifiers that include a printed circuit board having an interior opening that is mounted on a thermally conductive submount, it will be appreciated that embodiment of the present invention are not limited thereto. For example, pursuant to further embodiments of the present invention, the RF amplifiers may be ceramic open cavity RF amplifiers that include a ceramic dielectric substrate and metal leads that are used in place of the printed circuit boards that are included in the above-described embodiments. The ceramic substrate may include an interior opening and one or more RF amplifier dies may be mounted on the thermally conductive submount within the interior opening in the ceramic substrate. Metal leads are mounted on the ceramic substrate opposite the thermally conductive submount so that the ceramic substrate isolates the metal leads from the thermally conductive submount. The metal leads may extend outside a package of the packaged RF amplifier to electrically connect the RF amplifier dies to external components.

Figure 8A:
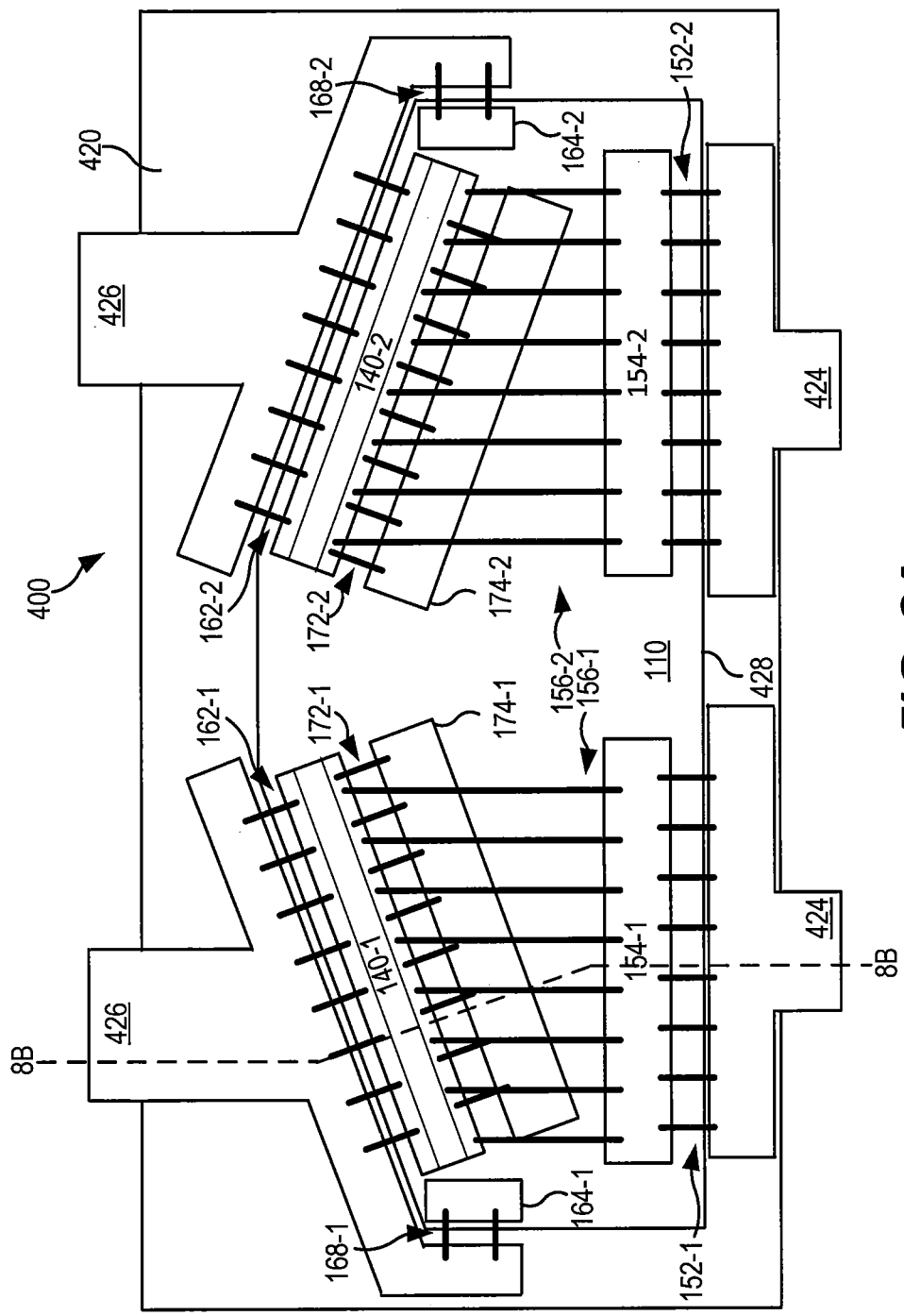
FIG. 8A is a schematic plan view of an RF amplifier to further embodiments of the present invention.
Figure 8B:
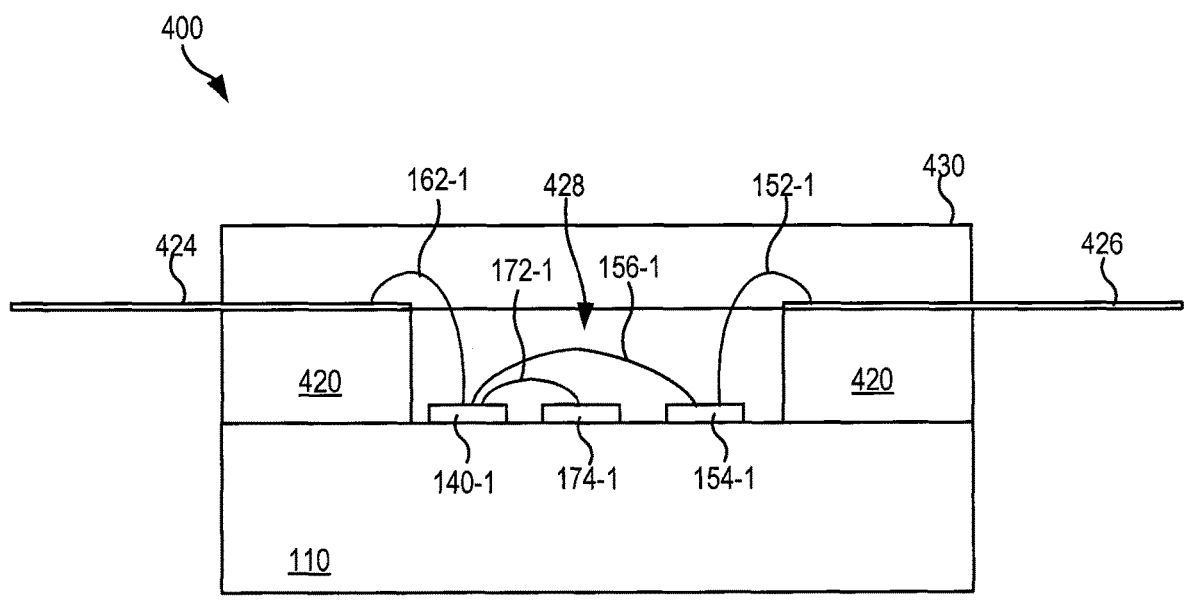
FIG. 8B is a cross section taken along line 8B-8B of FIG. 8A.

FIGS. 8A and 8B illustrate a ceramic open cavity RF amplifier 400 according to embodiments of the present invention. In particular, FIG. 8A is a schematic plan view of an RF amplifier 400 while FIG. 8B is a cross section taken along line 8B-8B of FIG. 8A.

The RF amplifier 400 of FIGS. 8A-8B may be very similar to the RF amplifier 100 of FIGS. 4A-4B, except that in RF amplifier 400 the printed circuit board 120 that is included in RF amplifier 100 is replaced with a ceramic substrate 420 that includes an opening 428, as well as metal leads 424, 426. The ceramic substrate 420 may perform the function of the dielectric layer 122 of printed circuit board 120 of RF amplifier 100 and the metal leads 424, 426 may perform the functionality of the metallized regions 124, 126 of printed circuit board 120. The metal leads 424, 426 may comprise metal lead frames that are formed of, for example, 5 mil thick copper. The metal leads 424, 426 may extend beyond the ceramic substrate 420 when the RF amplifier 400 is viewed in plan view (i.e., from the top) and may extend outside a housing of the RF amplifier 400 that is defined by the thermally conductive submount 110, the ceramic substrate 420 and a ceramic lid 430 (FIG. 8B). Bond wires 152-1, 152-2 connect the input impedance matching capacitor dies 154-1, 154-2 to the respective metal leads 424, and bond wires 162-1, 162-2 connect the outputs of the RF amplifier dies 140-1, 140-2 to the respective metal leads 426. As shown in FIGS. 8A-8B, the same components may be included in the interior opening 428 of RF amplifier 400 as are included in the interior opening 128 in printed circuit board 120 of RF amplifier 100, so further description of those components will be omitted here. It will be appreciated that the embodiments of FIGS. 6-7C may similarly be modified to include a ceramic substrate and metal leads in place of the printed circuit boards included in those embodiments.

According to still further embodiments of the present invention, RF amplifiers are provided that comprise a plurality of dies that are mounted on a printed circuit board such as, for example, a mother board of an electronic device. Each die may comprise an individual device such as an RF amplifier, an impedance matching capacitor die, a harmonic termination capacitor die, etc. The individual dies may be mounted on the printed circuit board, or within one or more openings in the printed circuit board, and interconnected via, for example, bond wires. In an example embodiment, the RF amplifier may comprise a Doherty amplifier that includes both a peaking amplifier die and a main amplifier die. Each amplifier die may include an associated input impedance matching capacitor die and/or an associated output impedance matching capacitor die. Longitudinal axes of the RF amplifier dies may be oriented at any of the angles discussed herein with respect to longitudinal axes of either their associated input impedance matching capacitor die and/or their associated output impedance matching capacitor die. Thus, it will be appreciated that all of the techniques according to the present invention discussed above are equally applicable in applications where individual packaged die are mounted on or in a printed circuit board such as a mother board.

Figure 9:
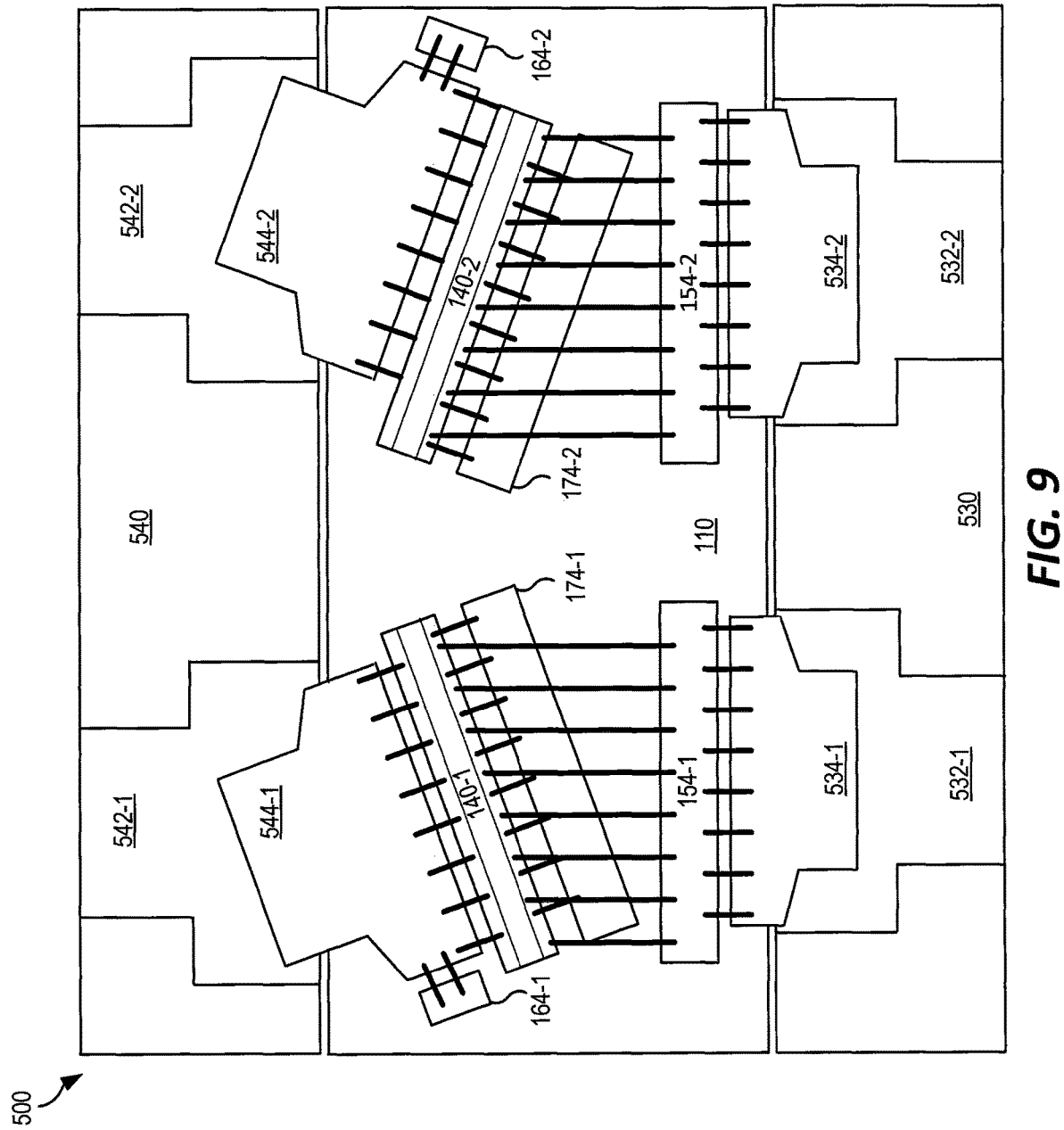
FIG. 9 is a schematic plan view of an RF amplifier to still further embodiments of the present invention.

FIG. 9 is a schematic perspective plan view of an RF amplifier 500 according to still further embodiments of the present invention. RF amplifier 500 is implemented in a plastic overmold package. The overmold structure is omitted in FIG. 9 to reveal the interior components of RF amplifier 500. As shown in FIG. 9, the RF amplifier 500 includes a thermally conductive submount 110 that has a plurality of RF amplifier and capacitor dies mounted thereon. The RF amplifier and capacitor dies that are mounted on the thermally conductive submount 110 may be the same one that are included in the interior opening 128 in the printed circuit board 120 of RF amplifier 100, so further description of those components will be omitted here.

A pair of plastic substrates 530, 540 are provided that are mounted on opposed sides of the thermally conductive submount 110. Plastic substrate 530 includes metallized regions 532-1, 532-2 and plastic substrate 540 includes metallized regions 542-1, 542-2. The metallized regions 532, 542 may be formed using conventional metallization techniques. Input metal flanges 534-1, 534-2 are provided that have one end mounted on the respective metallized regions 532-1, 532-2 of plastic substrate 530 and an opposed end mounted on the thermally conductive flange 110. Bond wires 152-1, 152-2 connect the input impedance matching capacitor dies 154-1, 154-2 to the respective input metal flanges 534-1, 534-2. Output metal flanges 544-1, 544-2 are provided that have one end mounted on the thermally conductive flange 110 and an opposed end mounted on the respective metallized regions 542-1, 542-2 of plastic substrate 540. Bond wires 172-1, 172-2 connect the RF amplifier dies 140-1, 140-2 to the respective output metal flanges 544-1, 544-2.

The RF amplifier dies 140-1, 140-2 and the capacitor dies 174-1, 174-2 are angled in the embodiment of FIG. 9 in the same manner as in the above-described embodiments in order to reduce the inductance of the output impedance matching circuits.

Figure 10A:
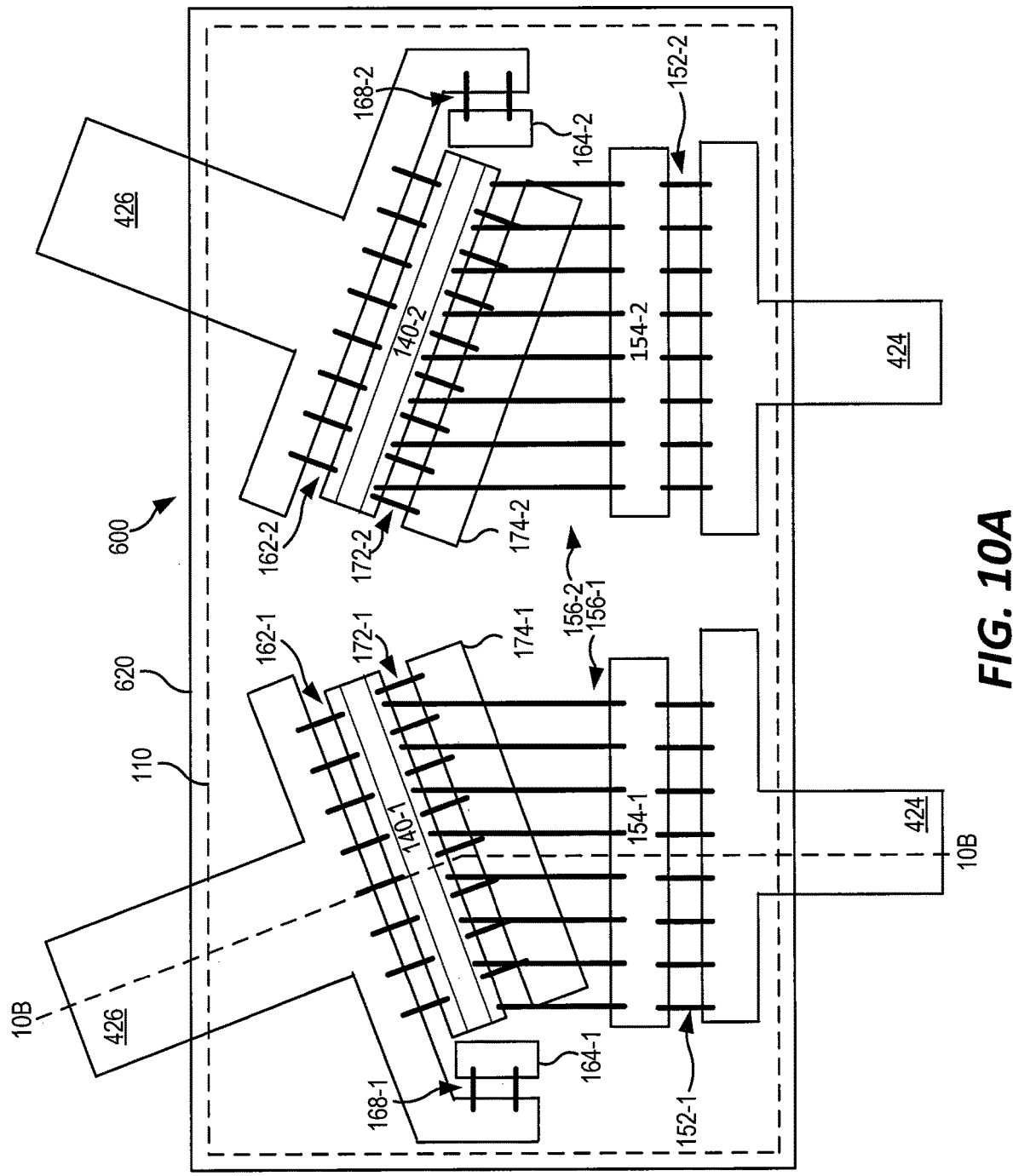
FIG. 10A is a schematic plan view of an RF amplifier to still further embodiments of the present invention.
Figure 10B:
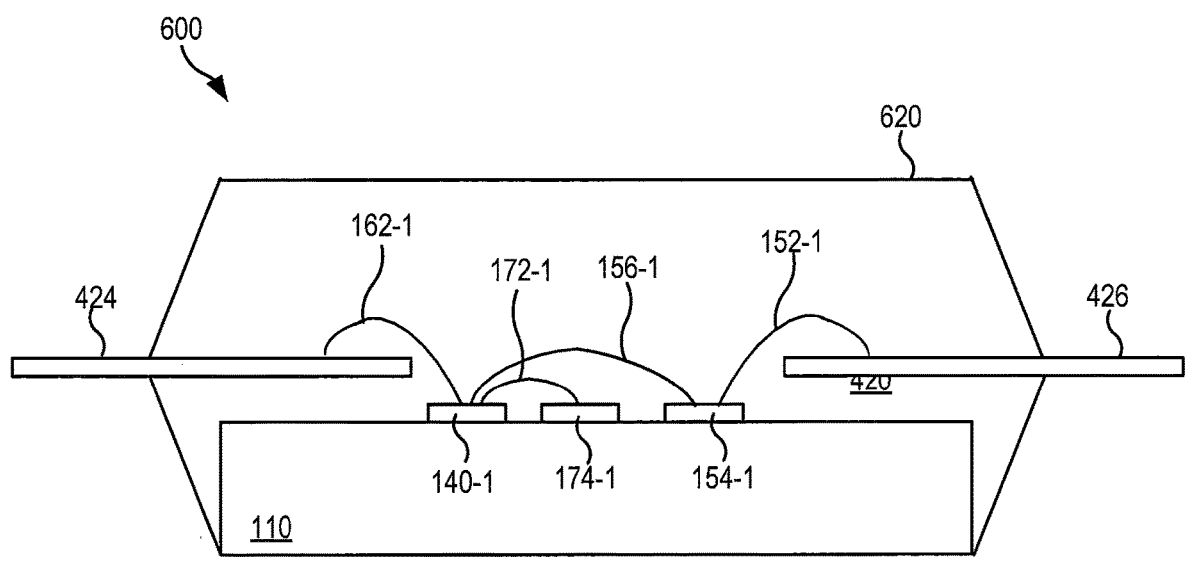
FIG. 10B is a cross section taken along line 10B-10B of FIG. 10A.

FIGS. 10A and 10B illustrate a plastic overmold RF amplifier 600 according to still further embodiments of the present invention. In particular, FIG. 10A is a schematic plan view of an RF amplifier 600 that includes a plastic overmold package while FIG. 10B is a cross section taken along line 10B-10B of FIG. 10A.

The RF amplifier 600 of FIGS. 10A-10B is similar to the RF amplifier 400 of FIGS. 8A-8B, except that the ceramic substrate 420 and lid 430 that are included in RF amplifier 400 are replaced in RF amplifier 600 with an overmold package 620 such as a plastic overmold. As shown in FIGS. 10A-10B, metal leads 424, 426 (e.g., metal lead frames) are provided which may be similar to or identical to the metal leads 424, 426 included in RF amplifier 400. As is also shown in FIGS. 10A-10B, the RF amplifier 600 further includes first and second RF amplifier dies 140-1, 140-2, first and second input impedance matching capacitor die 154-1, 154-2, first and second harmonic termination capacitor die 174-1, 174-2 and first and second output impedance matching capacitor die 164-1, 164-2 that are mounted on a thermally conductive submount 110. The thermally conductive submount 110 may comprise, for example, a metal substrate or a ceramic substrate. The various die are interconnected by bond wires and the metal leads 426 in the same manner as discussed above with reference to the RF amplifier 400, and hence further description of the electrical connections will be omitted here. The metal leads 424, 426 extend outside of the plastic overmold 620. It will be appreciated that the embodiments of FIGS. 6-7C may similarly be modified to use a package comprising a submount 110, an overmold package 620 and metal leads 424, 426 in place of the printed circuit boards and lids included in those embodiments. As with the other embodiments disclosed herein, different configurations of dies may be used.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:
1. A radio frequency ("RF") amplifier, comprising:
a submount;
a dielectric substrate mounted on an upper surface of the submount, the dielectric substrate having a first outer sidewall, a second outer sidewall that is opposite and substantially parallel to the first outer sidewall, and an interior opening;
conductive leads on the dielectric substrate; and
an RF amplifier die mounted on the submount within the interior opening of the dielectric substrate, a longitudinal axis of the RF amplifier die defining a first axis,
wherein a first angle defined by the intersection of the first axis with the first outer sidewall is between 5° degrees and 45°.

2. The RF amplifier of claim 1, further comprising an input impedance matching capacitor die that is mounted on the upper surface of the submount within the interior opening in the dielectric substrate.

3. The RF amplifier of claim 2, wherein a longitudinal axis of the input impedance matching capacitor die defines a third axis, and the first axis intersects the third axis at a third angle that is between 5° and 45°.

4. The RF amplifier of claim 2, further comprising a plurality of first bond wires that electrically connect the input impedance matching capacitor die to the RF amplifier die, wherein a maximum height of a first of the first bond wires above the upper surface of the submount is less than a maximum height of a second of the first bond wires above the upper surface of the submount.

5. The RF amplifier of claim 4, wherein all of the first bond wires have substantially a same inductance.

6. The RF amplifier of claim 5, wherein the first of the first bond wires is closer to a center of the submount than is the second of the first bond wires.

7. The RF amplifier of claim 2, further comprising an output impedance matching capacitor die that is mounted on the upper surface of the submount within the interior opening in the dielectric substrate, wherein a longitudinal axis of the output impedance matching capacitor die defines a fifth axis, and the fifth axis intersects an axis defined by the first outer sidewall is at an angle of between 45° and 80°.

8. The RF amplifier of claim 1, wherein the RF amplifier die is a first RF amplifier die, the RF amplifier further comprising a second RF amplifier die that has a longitudinal axis that defines a second axis, wherein the first and second axes intersect at an angle of between 90° and 170°.

9. A radio frequency ("RF") amplifier, comprising:
a submount;
an RF amplifier die mounted on the submount, a longitudinal axis of the RF amplifier die defining a first axis;
an input impedance matching capacitor die that is mounted on the upper surface of the submount, a longitudinal axis of the input impedance matching capacitor die defining a third axis; and
a plurality of bond wires that electrically connect the input impedance matching capacitor die to the RF amplifier die,
wherein an angle defined by the intersection of the first axis and the third axis is between 5° and 45°.

10. The RF amplifier of claim 9, further comprising a printed circuit board having an interior opening mounted on an upper surface of the submount, wherein the RF amplifier die and the input impedance matching capacitor die are both within the interior opening in the printed circuit board.

11. The RF amplifier of claim 10, wherein respective heights of the plurality of bond wires decrease the closer the bond wires are to the center of the submount.

12. The RF amplifier of claim 11, wherein the RF amplifier die is a first RF amplifier die, the RF amplifier further comprising a second RF amplifier die that has a longitudinal axis that defines a second axis, wherein the first and second axes intersect at an angle of between 90° and 170°.

13. The RF amplifier of claim 9, further comprising:
a first dielectric substrate with conductive paths thereon on a first side of the RF amplifier die;
a second dielectric substrate with conductive paths thereon on a second side of the RF amplifier die that is opposite the first side at least one input flange that extends between the first dielectric substrate and the submount; and
at least one output flange that extends between the submount and the second dielectric substrate.

14. The RF amplifier of claim 9, further comprising a first leadframe that is coupled to an input of the RF amplifier die and a second leadframe that is coupled to an output of the RF amplifier die.

15. The RF amplifier of claim 14, wherein the RF amplifier die and portions of the first and second lead frames and the submount are encapsulated in an overmold package.

16. A radio frequency ("RF") amplifier, comprising:
a printed circuit board;
a plurality of packaged integrated circuit die mounted on or in the printed circuit board, the packaged integrated circuit die including an RF amplifier die and an impedance matching capacitor die that is electrically connected to the RF amplifier die, where a longitudinal axis of the RF amplifier die defines a first axis and a longitudinal axis of the impedance matching capacitor die defines a second axis that intersects the first axis at an oblique angle.

17. The RF amplifier of claim 16, wherein the impedance matching capacitor die is an input impedance matching capacitor die.

18. The RF amplifier of claim 17, further comprising a plurality of first bond wires that electrically connect the input impedance matching capacitor die to the RF amplifier die, wherein a maximum height of a first of the first bond wires above the upper surface of the submount is less than a maximum height of a second of the first bond wires above the upper surface of the submount.

19. The RF amplifier of claim 18, wherein the first of the first bond wires is closer to a center of the submount than is the second of the first bond wires.

20. The RF amplifier of claim 17, further comprising an output impedance matching capacitor die that is mounted on or in the printed circuit board and that is electrically connected to the RF amplifier die, wherein a longitudinal axis of the output impedance matching capacitor die defines a third axis, and the third axis intersects the first axis at an angle of between 30° and 60°.

* * * * *